United States Patent [19]

Teggatz et al.

[11] Patent Number: 5,424,669
[45] Date of Patent: Jun. 13, 1995

[54] DIGITALLY CONTROLLED OUTPUT SLOPE CONTROL/CURRENT LIMIT IN POWER INTEGRATED CIRCUITS

[75] Inventors: Ross E. Teggatz; Joe A. Devore, both of Dallas, Tex.

[73] Assignee: Texas Instruments Incorporated, Dallas, Tex.

[21] Appl. No.: 55,071

[22] Filed: Apr. 29, 1993

[51] Int. Cl.⁶ .......................................... H03H 11/26
[52] U.S. Cl. .................................. 327/270; 327/399; 327/400
[58] Field of Search ................ 307/443, 572, 264, 584, 307/602, 603, 605, 595, 597; 328/55; 377/76; 327/399, 110, 270, 400

[56] References Cited

U.S. PATENT DOCUMENTS

| | | | |
|---|---|---|---|
| 3,747,260 | 10/1969 | Frohbach | 377/76 |
| 4,620,180 | 10/1986 | Carlton | 377/76 |
| 4,797,586 | 1/1989 | Traa | 328/55 |
| 5,216,289 | 6/1993 | Hahn et al. | 307/572 |

OTHER PUBLICATIONS

Takahashi, Hideo; Logic Circuit; Jan. 28, 1988; vol. 12 No. 30.

*Primary Examiner*—Timothy P. Callahan
*Assistant Examiner*—My Trang Nu Ton
*Attorney, Agent, or Firm*—Robby T. Holland; Wade James Brady, II; Richard L. Donaldson

[57] ABSTRACT

A slope control circuit having a plurality of resistive elements connected in parallel, each of the resistive elements including a control element for causing the associated resistive elements to be one of electrically conductive or electrically nonconductive, a delay circuit having a plurality of delay components coupled together in series, each of the delay components having a predetermined delay, the junction of each different adjacent pair of the delay components being coupled to the control element of a different one of the resistive elements and a load circuit coupled across the plurality of resistive elements. The circuit can further include a delay adjust circuit for adjusting the delay of each of the delay components, either initially or on-line. The resistance of each of the resistive elements can be the same or different. The plurality of resistive elements and the delay components are all disposed on a single semiconductor chip.

6 Claims, 2 Drawing Sheets

DIGITALLY CONTROLLED OUTPUT SLOPE CONTROL/CURRENT LIMIT IN POWER INTEGRATED CIRCUITS

BACKGROUND OF THE INVENTION

1. Field of the Invention

This invention relates to slope control and current limiting in power integrated circuits.

2. Brief Description of the Prior Art

Generally, in the case of power devices, primarily for automotive applications, it is desirable to control the rate of on and off switching due to EMF problems and RFI problems whereby such signals are not picked up by the automobile radio. This problem has usually been handled using an analog slope controller wherein the rate of change of current and voltage with time (di/dt and dv/dt) is controlled by gradually increasing the gate to source voltage of the power device which in turn gradually reduces the output impedance of the power devices. Analog slope controllers are also often utilized with di/dt sensing elements in the case of power devices that incorporate in the output circuitry recirculation diodes that have long recovery times. Prior art slope control and current limit circuits generally operate by adjusting the gate voltage of the power output device. Analog slope control circuits principally are controlled by an RC time constant, however the capacitance used is the gate capacitance of the power output device. This gate capacitance is not a constant value and varies as the gate/drain voltage varies. Also, the gate capacitance varies in view of the processing, causing the slope control ramp rate to vary. These two factors make it difficult to accurately control the slope in an analog slope control circuit. Such analog circuitry is generally complex, may be incompatible with the process being used to fabricate the integrated circuit or can occupy an undesirably large amount of real estate on the integrated circuit.

SUMMARY OF THE INVENTION

In accordance with the present invention, the above noted problems of the prior art are minimized by providing a circuit technique which can adjust the output impedance of the power device of the integrated circuit in discrete increments, thereby discretely adjusting the output current of the device. By utilizing the digitally controlled slope control in power outputs which can be modified via non-volatile memory, trim capabilities or clock frequency adjustment, a more accurate slope control is provided as compared with analog slope controls. This permits the user to program in the required turn on and turn off time for each output. A programmable slope control circuit allows for the elimination of use of the di/dt analog sensing elements by setting the output slope control to accommodate the power recovery time for a given diode in order to minimize the power dissipation in the power device and diode. Because the circuit of the present invention will incrementally adjust the output impedance of the power device, this circuit can also be used as a current limiting circuit. An application for this is found in the driving of incandescent lamps, which require current limiting schemes during turn on of the lamp.

To provide digitally controlled slope control, the power output gate is separated. Each gate of the device is brought quickly up to full gate voltage with a propagation delay separating the switching of each gate. The propagation value (delta t) and the number of output gates brought out defines the ramp rate of the slope control. The delta t circuitry is easily implemented with high density logic circuits. In addition, these logic circuits or cells can be adjusted with trim circuits, non-volatile memory circuitry or clock frequency adjustments.

Most slope control and current limit circuit schemes adjust the gate voltage of the power output device whereas, with a digitally controlled slope control circuit, the power output device has multiple gates brought out which are switched full "on" or "off".

The use of a digitally controlled slope control circuit or current limit scheme provides a simpler way of providing an "analog type" function. By using this procedure, less silicon area is required to achieve an accurate slope control circuit. The digitally controlled slope control circuit also can be easily adjusted with some sort of trim method.

More specifically, there is provided a slope control circuit having a plurality of resistive elements connected in parallel, each of the resistive elements including a control element for causing the associated resistive elements to be one of electrically conductive or electrically non-conductive, a delay circuit having a plurality of delay components coupled together in series, each of the delay components having a predetermined delay, the junction of each different adjacent pair of the delay components being coupled to the control element of a different one of the resistive elements and a load circuit coupled across the plurality of resistive elements. The circuit can further include delay adjust circuitry for adjusting the delay of each of the delay components, either initially or on-line. The resistance of each of the resistive elements can be the same or different. The plurality of resistive elements and the delay components are all disposed on a single semiconductor chip. The slope control circuitry can be applied to both high side and low side power output configurations.

DESCRIPTION OF THE PREFERRED EMBODIMENT

Figure 1A:
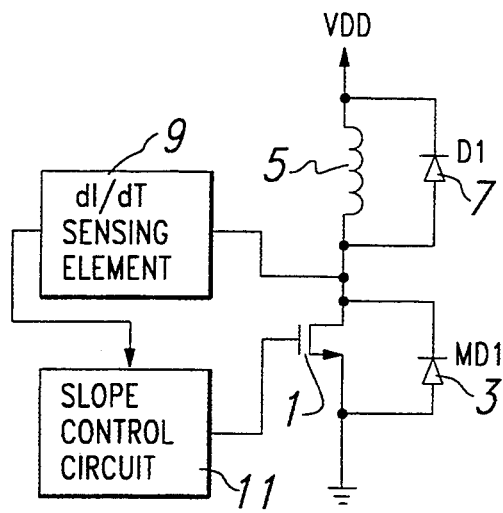
FIGS. 1a, 1b and 1c are schematic diagrams of prior art slope control circuits.

Referring first to FIG. 1a, there is shown a typical prior art analog slope control circuit. The circuit includes a power transistor 1 having a diode 3 from drain to source, the parallel combination of an inductor 5 and a diode 7 between $V_{DD}$ and the source and a di/dt sensing circuit 9 controlling a slope control circuit 11 in the source gate circuit of the power transistor controlling the power transistor. The concern is that if power transistor 1 turns on too quickly and diode 7 turns off too slowly (due to its reverse recovery time), the diode 7 and/or transistor 3 could be thermally destroyed or degraded. The di/dt sensing circuit 9 feeds back to the slope controlling circuit 11. Therefore, the current capability of transistor i is limited when it is switched, providing diode 7 with time to turn off, this helping to minimize the power dissipation due to switching.

Figure 1B:
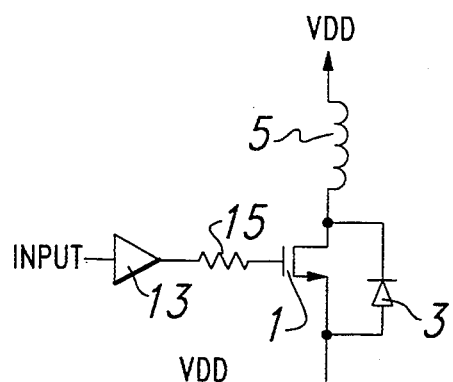

Referring now to FIG. 1b, there is shown a second prior art circuit as in FIG. 1a wherein the diode 7 has been removed and the di/dt sensing element 9 and slope control circuit 11 have been replaced by a DC pre-drive buffer 13 and resistor 15 directly coupled to the gate of the transistor 1.

Figure 1C:
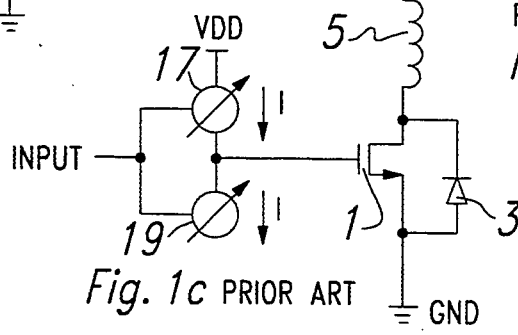

Referring now to FIG. 1c, there is shown a third prior art circuit as in FIG. 1b wherein the pre-drive buffer 13 and resistor 15 have been replaced by a pair of current sources 17 and 19 which are serially connected between $V_{cc}$ and ground, each of the current sources being controlled by the input to the circuit. The gate of the transistor 1 is coupled to the junction of the current sources 17 and 19.

Figure 2:
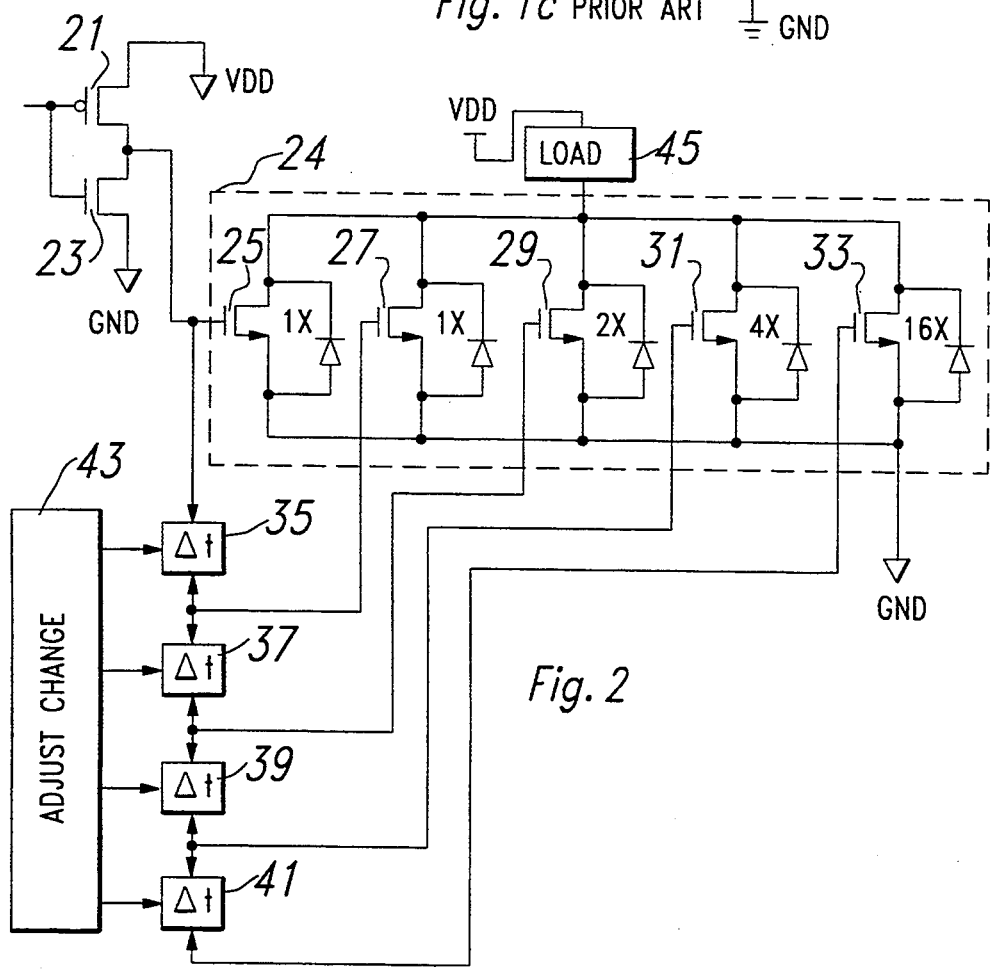
FIG. 2 is a circuit diagram of a slope control circuit in accordance with the present invention.

Referring now to FIG. 2, there is shown a slope control circuit in accordance with the present invention. The circuit includes input transistors 21 and 23. An input signal of proper polarity will turn on/off the transistors 21 and 23 which then apply a signal to a first transistor 25 of a bank of transistors 25, 27, 29, 31 and 33 (which comprise the power output transistor 24) as well as to a delay circuit (delta t) 35 of a bank of series delay circuits 35, 37, 39 and 41. The delay circuits can be any standard delay element such as, for example, an oscillator controlled counter, monostable multivibrator or series of inverters. The time delay of each of the delay circuits can be adjusted by a delay adjust circuit 43 which can include such delay using trim circuits, nonvolatile memory, oscillator time period adjustment and the like in known manner. The transistors 25, 27, 29, 31 and 33 are each designed to provide predetermined impedance in the circuit when turned on. This can be accomplished by sizing the components differently during fabrication in known manner. As can be seen, in the preferred embodiment transistors 25 and 27 have a resistance of one unit, transistor 29 has a resistance of two units, transistor 31 has a resistance of 4 units and transistor 33 has a resistance of 16 units. Other values or relative values of resistance can be provided.

In operation, with the transistors 21 and 23 turned on by an incoming signal of appropriate polarity, transistor 25 is turned on and places its resistance in the circuit between the output load 45 and ground. This incoming signal also travels through time delay circuit 35 and, after the delay period set into delay circuit 35 by the delay adjust circuit 43, turns on transistor 27. This places the parallel resistances of transistors 25 and 27 in the circuit to alter the slope. This procedure continues for time delay circuits 37, 39 and 41, thereby timewise placing additional resistances in parallel into the circuit. It can be seen that the slope of the circuit will change gradually in increments as each additional transistor is turned on and places parallel resistance into the circuit, the resistance going from essentially infinite to a relatively low value when all of the transistors are on. The relative time when each of the transistors is turned on is controlled by the delay circuits 35, 37, 39 and 41, the delay of which is determined initially or on-line by the delay adjust circuit 43. The same procedure can be used when turning off power output device 24.

Figure 3:
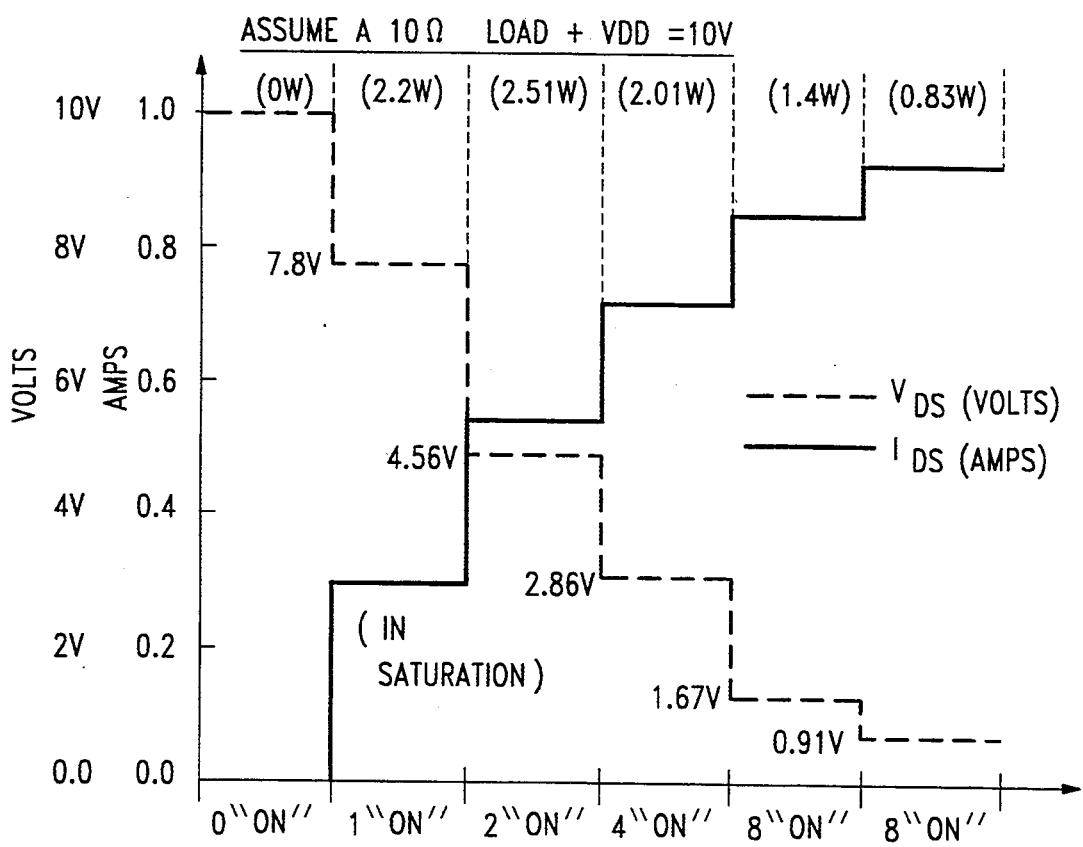
FIG. 3 is a graph showing the voltage and current between $V_{dd}$ and OUTPUT in FIG. 2 with a 10 ohm load and a 10 volt battery in series therewith.

The results described above are clearly shown with reference to FIG. 3 wherein a 10 volt battery and a 10 ohm load are used for $V_{dd}$ and output load 45, respectively and OUTPUT device 24 has a minimum drain to source resistance of about 1 ohm in the circuit of FIG. 2. As can be seen, with all of the transistors off, no current will flow and the voltage across the circuit of FIG. 2 is the full 10 volts of the battery and no power is dissipated. With transistor 25 turned on, the voltage drops to approximately 7.8 volts, the current increases to about 0.3 amperes and the power dissipation increases to 2.2 watts. With transistor 27 also turned on, the voltage drops to 4.56 volts, the current increases to about 0.5 amperes and the power dissipation increases to 2.51 watts. With transistor 29 also turned on, the voltage drops to 2.86 volts, the current increases to about 0.7 amperes and the power dissipation decreases to 2.01 watts. With transistor 31 also turned on, the voltage drops to 1.67 volts, the current increases to about 0.8 amperes and the power dissipation decreases to 1.4 watts. With transistor 33 also turned on, the voltage drops to 0.91 volts, the current increases to about 0.85 amperes and the power dissipation decreases to 0.83 watts. It can therefore be seen that the current through the output load is incrementally increased to its maximum current level.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A control circuit, comprising:
   (a) a plurality of resistive elements connected in parallel wherein the resistance of each of said restive elements is different, each of said restive elements including a control element, each said control element causing the restive element associated with said control element to be one of electrically conductive or electrically non-conductive;
   (b) a delay circuit having a plurality of delay components coupled together in series, each of said delay components having a predetermined delay, the junction of each different adjacent pair of said delay components being coupled to the control element of a different on of said restive elements;
   (c) a delay adjust circuit for adjusting the delay of each of said delay components; and
   (d) a load circuit coupled across said plurality of restive elements.

2. The circuit of claim 1 wherein said delay adjust circuit adjusts the delay of each of said delay components on-line.

3. The circuit of claim 1 wherein said plurality of resistive elements and said delay components are all disposed on a single semiconductor chip.

4. The circuit of claim 2 wherein said plurality of resistive elements and said delay components are all disposed on a single semiconductor chip.

5. A control circuit, comprising:
   (a) a plurality of controllable resistive elements connected in parallel wherein the resistance of each of said resistive elements is different, each of said resistive elements including a control element for causing the associated resistive element to be one of electrically conductive to provide a predetermined resistance therethrough or to be electrically non-conductive;
   (b) a delay circuit having a plurality of delay components, each of said delay components having an adjustable delay, each of said delay components coupled to a control element of a different one of said resistive elements to control operation of the associated resistive element;

(c) circuitry for adjusting the delay provided by each of said delay components; and (d) a load circuit coupled across said plurality of resistive elements.

6. The circuit of claim 5 wherein said delay adjust circuit adjusts the delay of each of said delay components on-line.

* * * * *